(12) United States Patent
Baranwal et al.

(10) Patent No.: US 10,281,946 B1
(45) Date of Patent: May 7, 2019

(54) INPUT CURRENT LIMIT IN DIGITAL INPUT RECEIVERS

(71) Applicant: TEXAS INSTRUMENTS INCORPORATED, Dallas, TX (US)

(72) Inventors: Shailendra Kumar Baranwal, Murphy, TX (US); Anant Shankar Kamath, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/996,917

(22) Filed: Jun. 4, 2018

Related U.S. Application Data

(60) Provisional application No. 62/584,350, filed on Nov. 10, 2017.

(51) Int. Cl.
*G05F 3/26* (2006.01)
*H03K 19/003* (2006.01)
*H03K 19/0185* (2006.01)
*H03F 3/16* (2006.01)

(52) U.S. Cl.
CPC ............... *G05F 3/267* (2013.01); *H03F 3/16* (2013.01); *H03K 19/00315* (2013.01); *H03K 19/018514* (2013.01); *H03K 19/018585* (2013.01); *H03F 2200/396* (2013.01)

(58) Field of Classification Search
None
See application file for complete search history.

(56) References Cited

U.S. PATENT DOCUMENTS

2015/0109708 A1* 4/2015 Cheng ..................... H02M 1/10
361/93.9
2018/0328973 A1* 11/2018 Kamath ............. H03K 17/7955

* cited by examiner

*Primary Examiner* — Cassandra F Cox
(74) *Attorney, Agent, or Firm* — John R. Pessetto; Charles A. Brill; Frank D. Cimino

(57) ABSTRACT

A bandgap voltage reference is provided in quasi-parallel with a resistor in the input path of a digital input circuit. Because of the quasi-parallel nature, the current used by the digital input circuit is limited to an amount based on the value of the external resistor. The input current is split between circuitry used to provide the logic signal across the selected isolation barrier and a sink transistor so that the current remains constant. This allows the digital input circuit to accurately limit input current without needing field-side power.

20 Claims, 3 Drawing Sheets

INPUT CURRENT LIMIT IN DIGITAL INPUT RECEIVERS

CROSS REFERENCE TO RELATED APPLICATIONS

This application claims the benefit under 35 U.S.C. § 119(e) of U.S. Provisional Patent Application Ser. No. 62/584,350, filed Nov. 10, 2017, titled "Input-Powered Isolated Digital Input Receiver with Current Limit and Precise Thresholds," which is hereby incorporated by reference as if reproduced in its entirety.

BACKGROUND

1. Field

The field is industrial controls, and more specifically, digital input logic circuitry used in industrial controls.

2. Description of the Related Art

In an industrial plant environment it is common to have various switches and sensors provide inputs for a control process. The switches and sensors are wired to digital inputs of industrial controllers, commonly known as programmable logic controllers.

Standards, such as IEC61131-2 specify that the input current of a digital input receiver must be at least 2 mA. Because there can be dozens or even hundreds of the digital input receivers in an industrial controller, power draw, and thus the required heat dissipation, can grow very large, especially if the input current is not well controlled.

Most opto-coupler based digital input receivers and some capacitive isolation digital input receivers do not have any input current regulation. Another series of digital input receivers does current limit but those digital input receivers use field side power, which is generally more problematic and not generally used. Some industrial controllers use JFETs (junction field-effect transistors) external to the digital input receivers to attempt to perform current limiting, but the variations in JFET threshold voltage cause any current control to be poor.

SUMMARY

A bandgap voltage reference is provided in quasi-parallel with a resistor in the input path of a digital input circuit. Because of the quasi-parallel nature, the current used by the digital input circuit is limited to an amount based on the value of the external resistor. The input current is split between circuitry used to provide the logic signal across the selected isolation barrier and a sink transistor so that the current remains constant. This allows the digital input circuit to accurately limit input current without needing field-side power.

BRIEF DESCRIPTION OF THE FIGURES

For a detailed description of various examples, reference will now be made to the accompanying drawings in which.

DETAILED DESCRIPTION OF THE EXAMPLES

Figure 1:
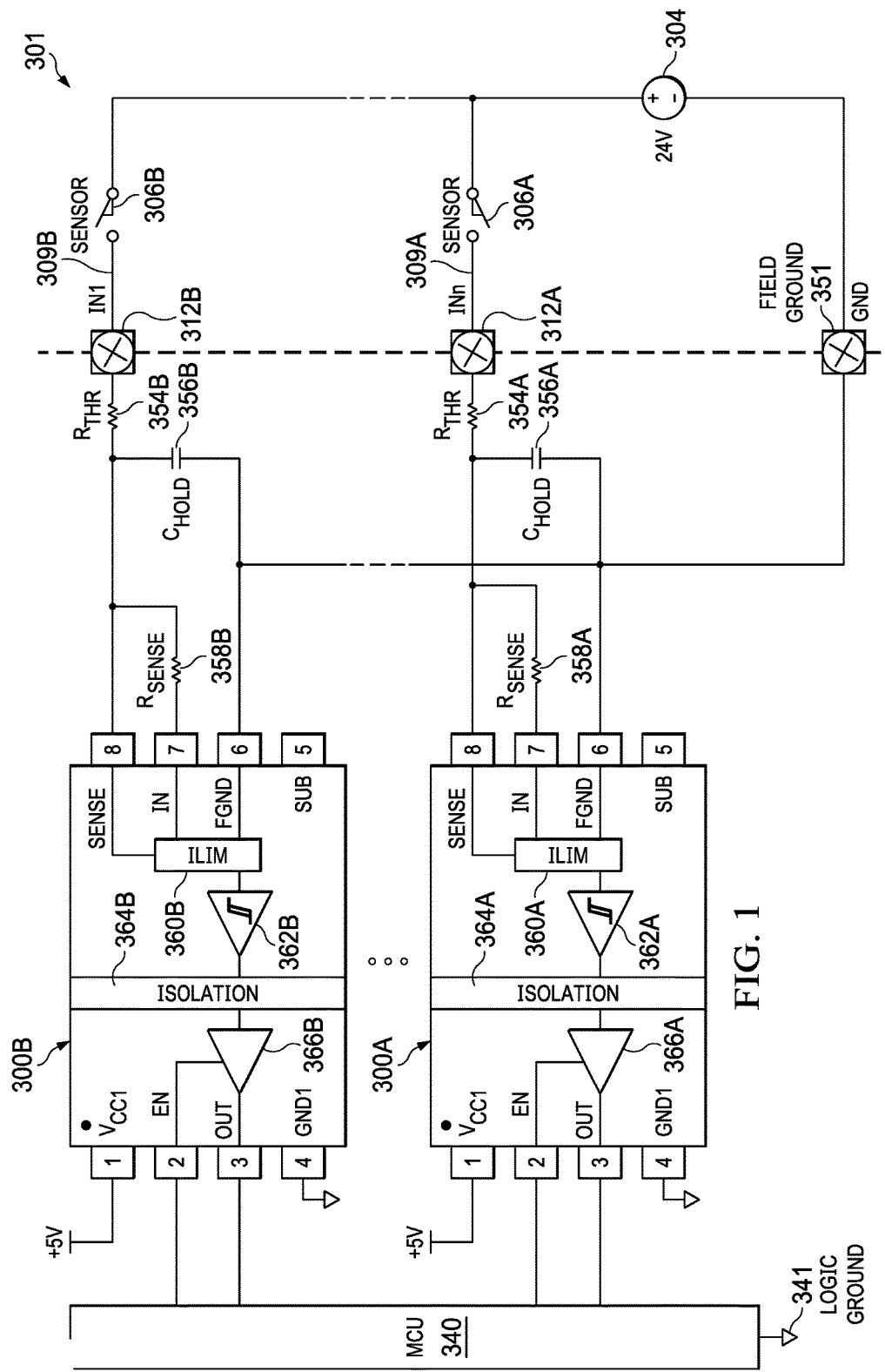
FIG. 1 is a block diagram of a first example of an industrial controller including a series of digital input circuits having input current limiting.

Referring now to FIG. 1, an example industrial controller 301 is illustrated. Two digital input circuits 300A and 300B are illustrated. A voltage source 304 provides voltage to the field. A switch 306A is connected from the voltage source 304 to one field input terminal 312A using a field input wire 309A. Similarly, a sensor 306B is connected from the voltage source 304 to a field input terminal 312B using a field input wire 309B. The current on the field input wires 309A, 309B is the current to be limited. In the example of FIG. 1, the digital input circuits 300A and 300B use high frequency carrier modulation across a silicon dioxide-based isolation barrier to provide the capacitive isolation between the field and the industrial controller 301. Some digital input circuits use electromagnetic coils and inductive coupling, while other digital input circuits use photodiodes and phototransistors and optical coupling. While the different types of digital input circuits may have different input current requirements to operate, operation is similar so that the present input current limiting can be applied in each type of digital input circuits.

A FGND or field ground pin of each digital input circuit 300A and 300B is connected to a field ground terminal 351. A threshold resistor 354A, 354B is connected to the field input terminal 312A, 312B. The other end of the threshold resistor 354A, 354B is connected to a sense input of the digital input circuit 300A, 300B; to one terminal of a hold capacitor 356A, 356B and to one end of a current limit resistor 358A, 358B. The second side of the hold capacitor 356A, 356B is connected to field ground. The second end of the current limit resistor 358A, 358B is connected to an input pin of the digital input circuit 300A, 300B. The $V_{CC}$ input of the digital input circuit 300A, 300B is connected to a voltage source such as 5 V. A logic output pin of the digital input circuit 300A, 300B is connected to a logic input of a microcontroller 340, so that the logic value at the field input terminal 312A, 312B is provided to the microcontroller 340 for use in controlling the industrial process. An enable input of the digital input circuit 300A, 300B is also connected to the microcontroller 340 in the illustrated example. It is understood that in many designs the enable inputs and the outputs of the digital input circuits would be coupled to the microcontroller 340 through latches and buffers, rather than being directly connected as illustrated. It is understood that the microcontroller 340 includes random access memory and non-volatile memory, such as flash memory, either internally or externally. The non-volatile memory stores programs executed by the microcontroller 34*o* to perform its various functions.

Each digital input circuit 300A, 300B uses capacitive isolation to provide the isolation feature in one example. The sense, input and field ground pins of the digital input circuit 300A, 300B are connected to a current limit block 360A, 360B. The input is also provided as the input to an oscillator block or input side isolation driver circuitry 362A, 362B which provides an oscillating signal to cross the capacitive isolation barrier 364A, 364B. An output side isolation driver 366A, 366B receives the oscillating signals from the capacitive isolation barrier 364A, 364B and provides the logic output signal to the logic output pin. The enable pin is connected to the driver 366A, 366B to control the output.

Figure 2:
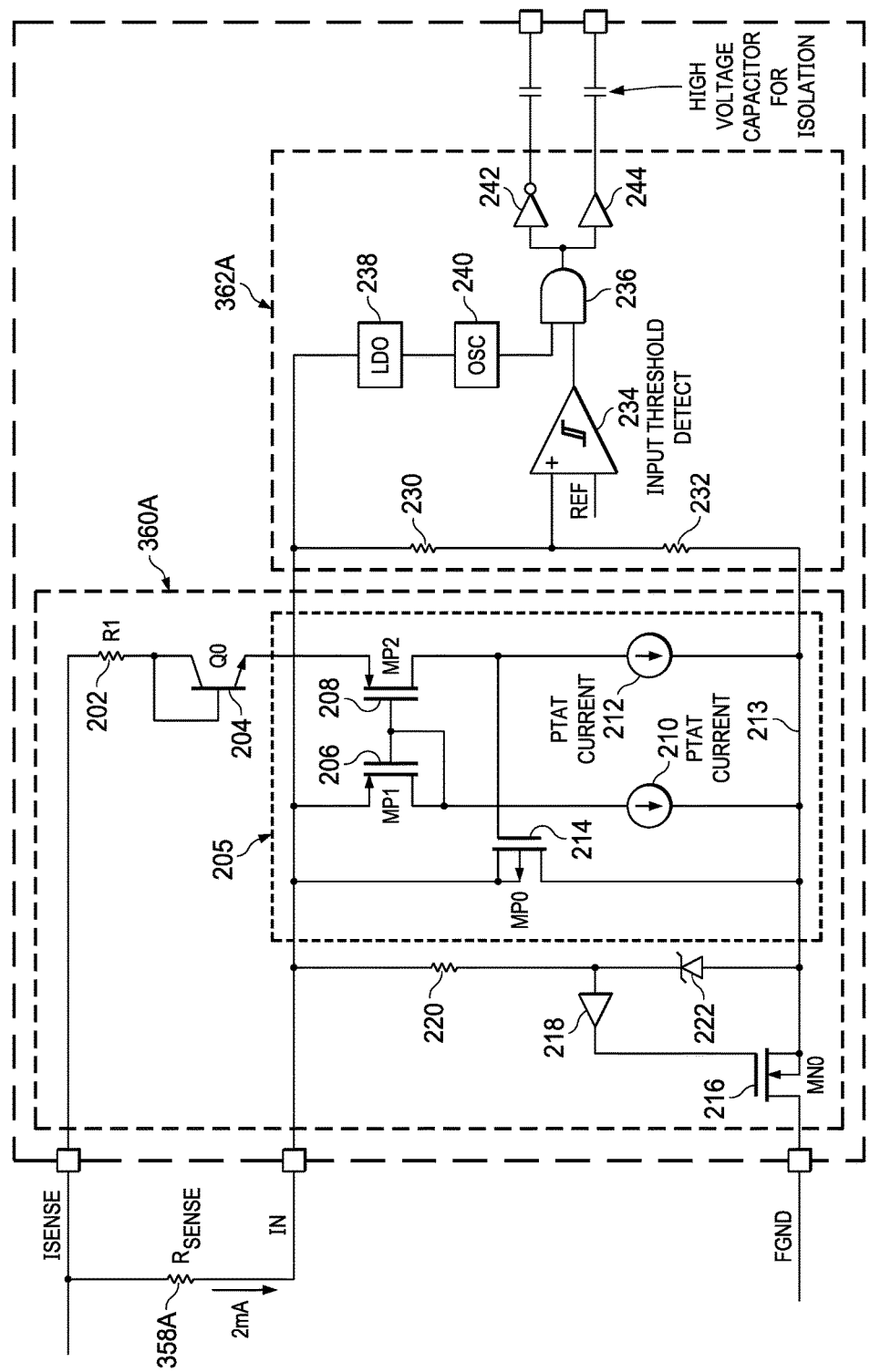
FIG. 2 is a more detailed block diagram of the input side of the digital input circuits of FIG. 2.

FIG. 2 provides details of the current limit block 360A and the oscillator block 362A. The voltage across the current limit resistor 358A or $R_{SENSE}$ is compared with a reference voltage developed across resistor 202 or R1 and bipolar NPN (n-type p-type n-type) transistor 204 or Q0, which form a bandgap voltage reference of approximately 1.2 V. If the current limit resistor 358A is chosen to be 600 ohms, then the voltage across the current limit resistor 358A is 1.2 V when the current is 2 mA, the minimum current specified in IEC61131-2. The current can be closely controlled if a precision resistor is used for current limit resistor 358A. The use of the external current limit resistor 358A is lower cost than a solution provided internal to the digital input circuit 300A and allows setting the input current at a value other than 2 mA by using a value other than 600 ohms. The precision of the current limit is primarily based on the accuracy of the current limit resistor. Using a 1% resistor results in a very accurate current limit. If less accuracy of the current limit is tolerable, then a lower precision resistor, such as a 5% resistor, can be used. In another example, the current limit resistor is provided on the same semiconductor as the remainder of the digital input circuit, removing the need for the external current limit resistor, if the space needed for the external resistor is not desirable and current limit flexibility is not needed. If the internal current limit resistor is used, then only the sense pin is needed as the input is developed internally from the current limit resistor.

Transistor 206 or MP1 and transistor 208 or MP2 form an amplifier to control the current through the current limit resistor 358A. Transistor 206 is a P-channel enhancement MOSFET (metal-oxide-semiconductor field-effect transistor) with the source connected to the input pin and the gate connected to the drain. Transistor 208 is a P-channel enhancement MOSFET with the source connected to the collector of the transistor 204 and the gate connected to the gate of transistor 206. This configuration places the current limit resistor 358A and the bandgap voltage reference in quasi-parallel and has the sources of the transistors 206 and 208 acting as inputs. The drains of transistors 206 and 208 are each connected to the input of a PTAT (proportional to absolute temperature) current source 210 and 212, respectively. The outputs of the PTAT current sources 210, 212 are connected to a common line 213.

A P-channel depletion MOSFET 214 or MP0 has the source connected to the input pin, the gate connected to the drain of transistor 208 and the drain connected to the common line 213. Therefore the gate or control input of the MOSFET 214 is connected to the output of the amplifier formed by transistors 260 and 208. In this configuration MOSFET 214 sinks extra current not used by the oscillator block 362A to keep total input current constant at the target, such as 2 mA. Thus the transistors 206, 208, the MOSFET 214 and the PTAT current sources 210, 212 form current sharing circuitry 205.

Reverse polarity blocking is provided by N-channel depletion MOSFET 216 or MN0. The source of MOSFET 216 is connected to the common line 213. The drain of the MOSFET 216 is connected to the field ground pin. The gate of the MOSFET 216 is connected to the output of a buffer 218. The input of the buffer 218 is connected to one end of a resistor 220 and the cathode of a Zener diode 222. The second end of the resistor 220 is connected to the input pin. The anode of the Zener diode 222 is connected to the common line 213.

The input pin is connected to the input of the input side isolation driver circuitry or oscillator block 362A. A resistor divider is formed by resistors 230 and 232 connected between the input pin and the common line 213. The connection of the resistors 230 and 232 is the positive input to a comparator 234. The negative input of the comparator 234 is connected to a reference voltage. The output of the comparator 234 then tracks the logic level of the input voltage high or low. The value of the threshold resistor 354A sets the low-going and high-going level transition voltages of the comparator 234. In one example, a threshold resistor 354A value of zero ohms sets the low and high thresholds at 7 volts and 8.2 volts, respectively. In another example, a threshold resistor 354A value of 1 kiloohms sets the low and high thresholds at 9.2 volts and 10.4 volts, respectively. In a third example, a threshold resistor 354A value of 4 kiloohms sets the low and high thresholds at 15.8 volts and 17 volts, respectively. The output of the comparator 234 is provided as one input to an AND gate 236.

The input pin is also connected to the input of a low dropout regulator (LDO) 238, which has an exemplary output voltage of 1.8 V. The output of the LDO 238 is provided as the input to an oscillator 240, which provides the basic oscillating signal that is used to cross the capacitive isolation barrier. When the field input is at a voltage greater than needed for the LDO 238, the oscillator 240 is active. Thus the oscillator 240 is active when the input logic level is high but may not be active when the input logic level is low as that logic level may be below the level needed for the LDO 238 to operate. The output of the oscillator 240 is provided as the second input of the AND gate 236. Thus, the output of the AND gate 236 is oscillating when the input logic level is high or one and is zero when the input logic level is zero or low. The term logic level being high or low is used here as the actual voltages for logic one and logic zero are dependent on the environment of the digital input circuit.

The output of the AND gate 236 is provided to the input of an inverter 242 and a buffer 244. The output of the inverter 242 is controlled by the output of the LDO 238, while the output of the buffer 244 is controlled by the common line 213. The outputs of the inverter 242 and the buffer 244 act as a driver to drive one side of capacitors forming the capacitive isolation barrier.

Because the oscillator block 362A is directly connected to the input pin, the oscillator block 362A can draw as much operating current as needed, up to the current limit set by the current limit resistor 358A, with any remaining input current, the difference between the input current and the operating current, being sunk by the MOSFET 214. A similar current splitting is done if the input side isolation driver circuitry or oscillator block 362A is replaced by electromagnetic or optical blocks.

Figure 3:
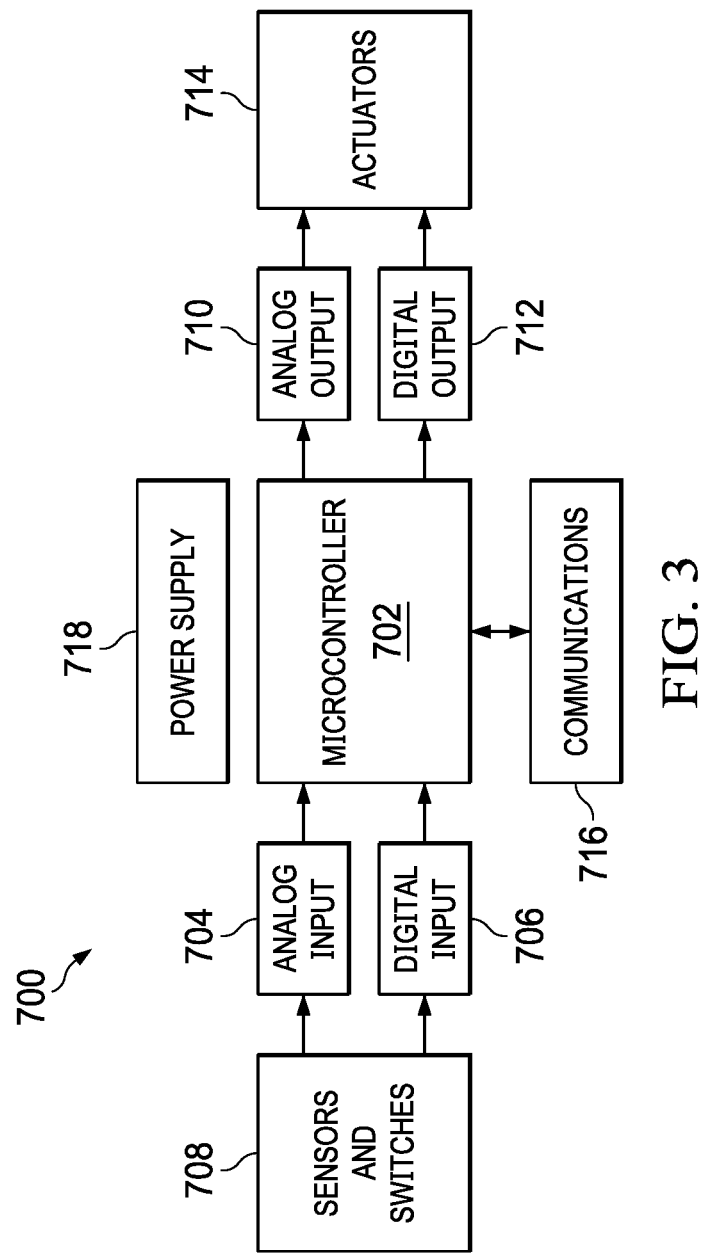
FIG. 3 is a block diagram of a typical industrial controller.

FIG. 3 is a block diagram of a typical industrial controller or programmable logic controller 700. A microcontroller 702 provides the intelligence in the industrial controller 700. Analog inputs 704 and digital inputs 706 are connected to the microcontroller 702. Analog inputs 704 and digital inputs 706 receive their inputs from various sensors and switches 708 located in the environment in the field. The digital inputs 706 often are often formed using digital input circuits such as digital input circuits 300A, 300B. The microcontroller 702 provides outputs to analog outputs 710 and digital outputs 712. The analog outputs 710 and the digital outputs 712 are connected to actuators 714 connected in the field to operate mechanisms as required to control the desired process. A communications module 716 is connected microcontroller 702 and is interconnected to other industrial controllers and is provided for programming purposes of the microcontroller 702. A power supply 718 provides power to the industrial controller 700 generally. It is understood that this is a very simplistic illustration of an industrial controller for explanation purposes and that the industrial controller can have many different architectures The microcontroller 702 includes flash memory containing software to manage the industrial controller 700 to manage the desired process.

By using a bandgap voltage reference in quasi-parallel with an external resistor, the current used by the digital input circuit is limited to an amount based on the value of the external resistor. The current is split between the circuitry used to provide the logic signal across the selected isolation barrier and a sink transistor so that the current remains constant. This allows the digital input circuit to accurately limit input current without needing field-side power.

The above description is intended to be illustrative, and not restrictive. For example, the above-described examples may be used in combination with each other. Many other examples will be apparent upon reviewing the above description. The scope should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. An industrial controller comprising:
    a field input terminal for connecting to a field input wire, the field input wire carrying an input current to be limited;
    a field ground terminal;
    a digital input circuit having a field input coupled to the field input terminal, a field ground coupled to the field ground terminal and a sense input; and
    a current limit resistor coupled to the field input and the sense input of the digital input circuit,
    wherein the digital input circuit includes:
        a bandgap voltage reference having one end coupled to the sense input and having a second end;
        input side isolation driver circuitry coupled to the field input and the field ground for driving a signal across an isolation barrier and drawing an operation current from the field input; and
        current sharing circuitry coupled to the field input, the field ground and the second end of the bandgap voltage reference to sink the difference between the input current and the operation current to maintain the voltage across the current limit resistor to the bandgap voltage reference.

2. The industrial controller of claim 1, wherein the current limit resistor is external to the digital input circuit.

3. The industrial controller of claim 1, wherein the current limit resistor is included in the digital input circuit and the field input is developed internally to the digital input circuit.

4. The industrial controller of claim 1, wherein the digital input circuit further includes:
    a reverse polarity blocking circuit connected to the field ground and coupled to the input side isolation driver circuitry and the current sharing circuitry.

5. The industrial controller of claim 1, wherein the current sharing circuitry includes:
    an amplifier having inputs connected to the field input and the second end of the bandgap voltage reference and having an output; and
    a transistor having a control input coupled to the amplifier output and coupled between the field input and the field ground.

6. The industrial controller of claim 1, wherein the input side isolation driver circuitry includes:
    a comparator coupled between the field input and the field ground and providing an output dependent on the voltage of the field input;
    an oscillator coupled to the field input to provide an oscillating output signal on a field input high logic level;
    a gate to combine the oscillator output signal and the comparator output and provide an oscillating output when the field input is at a high logic level; and
    a driver coupled to the gate output to drive a signal across the isolation barrier.

7. The industrial controller of claim 6, wherein the input side isolation driver circuitry further includes a low dropout regulator coupled between the field input and the oscillator to provide a signal to the oscillator when the field input is at a high logic level.

8. A digital input circuit for a controller, the controller including a field input terminal for connecting to a field input wire, the field input wire carrying an current to be limited and a field ground terminal, the digital input circuit comprising:
    a field input for coupling to the field input terminal;
    a field ground for coupling to the field ground terminal;
    a sense input, the sense input and the field input for coupling to a current limit resistor;
    a bandgap voltage reference having one end coupled to the sense input and having a second end;
    input side isolation driver circuitry coupled to the field input and the field ground for driving a signal across an isolation barrier and drawing an operation current from the field input; and
    current sharing circuitry coupled to the field input, the field ground and the second end of the bandgap voltage reference to sink the difference between the input current and the operation current to maintain the voltage across a coupled current limit resistor to the bandgap voltage reference.

9. The digital input circuit of claim 8, wherein the current limit resistor is external to the digital input circuit.

10. The digital input circuit of claim 8, wherein the current limit resistor is included in the digital input circuit and the field input is developed internally to the digital input circuit.

11. The digital input circuit of claim 8, wherein the digital input circuit further includes:
    a reverse polarity blocking circuit connected to the field ground and coupled to the input side isolation driver circuitry and the current sharing circuitry.

12. The digital input circuit of claim 8, wherein the current sharing circuitry includes:
    an amplifier having inputs connected to the field input and the second end of the bandgap voltage reference and having an output; and
    a transistor having a control input coupled to the amplifier output and coupled between the field input and the field ground.

13. The digital input circuit of claim 8, wherein the input side isolation driver circuitry includes:
    a comparator coupled between the field input and the field ground and providing an output dependent on the voltage of the field input;
    an oscillator coupled to the field input to provide an oscillating output signal on a field input high logic level;
    a gate to combine the oscillator output signal and the comparator output and provide an oscillating output when the field input is at a high logic level; and a driver coupled to the gate output to drive a signal across the isolation barrier.

14. The digital input circuit of claim 13, wherein the input side isolation driver circuitry further includes a low dropout regulator coupled between the field input and the oscillator to provide a signal to the oscillator when the field input is at a high logic level.

15. A method of limiting an input current to a controller, the controller including a field input terminal for connecting to a field input wire, the field input wire carrying the input current to be limited and a field ground terminal, the method comprising:
   providing a digital input circuit having a field input for coupling to the field input terminal, a field ground for coupling to the field ground terminal, a sense input, a bandgap voltage reference having one end coupled to the sense input and having a second end, input side isolation driver circuitry coupled to the field input and the field ground for driving a signal across an isolation barrier and drawing an operation current from the field input, and current sharing circuitry coupled to the field input, the field ground and the second end of the bandgap voltage reference to sink the difference between the input current and the operation current to maintain the voltage across a coupled current limit resistor to the bandgap voltage reference; and
   connecting a current limit resistor across the field input and the sense input of the digital input circuit, the current limit resistor having a value equal to the voltage of the bandgap voltage reference divided by the current limit of the input current.

16. The method of claim 15, wherein the current limit resistor is external to the digital input circuit.

17. The method of claim 15, wherein the digital input circuit further includes:
   a reverse polarity blocking circuit connected to the field ground and coupled to the input side isolation driver circuitry and the current sharing circuitry.

18. The method of claim 15, wherein the current sharing circuitry includes:
   an amplifier having inputs connected to the field input and the second end of the bandgap voltage reference and having an output; and
   a transistor having a control input coupled to the amplifier output and coupled between the field input and the field ground.

19. The method of claim 15, wherein the input side isolation driver circuitry includes:
   a comparator coupled between the field input and the field ground and providing an output dependent on the voltage of the field input;
   an oscillator coupled to the field input to provide an oscillating output signal on a field input high logic level;
   a gate to combine the oscillator output signal and the comparator output and provide an oscillating output when the field input is at a high logic level; and
   a driver coupled to the gate output to drive a signal across the isolation barrier.

20. The method of claim 19, wherein the input side isolation driver circuitry further includes a low dropout regulator coupled between the field input and the oscillator to provide a signal to the oscillator when the field input is at a high logic level.

\* \* \* \* \*